United States Patent
Lee et al.

(10) Patent No.: US 9,312,287 B2
(45) Date of Patent: Apr. 12, 2016

(54) DISPLAY PANEL AND DISPLAY DEVICE

(71) Applicant: InnoLux Corporation, Jhu-Nan, Miao-Li County (TW)

(72) Inventors: Kuan-Feng Lee, Jhu-Nan (TW); Hui-Chieh Wang, Jhu-Nan (TW)

(73) Assignee: InnoLux Corporation, Jhu-Nan, Miao-Li County (TW)

( * ) Notice: Subject to any disclaimer, the term of this patent is extended or adjusted under 35 U.S.C. 154(b) by 0 days.

(21) Appl. No.: 14/625,429

(22) Filed: Feb. 18, 2015

(65) Prior Publication Data

US 2015/0243684 A1 Aug. 27, 2015

(30) Foreign Application Priority Data

Feb. 25, 2014 (TW) .............................. 103106290 A

(51) Int. Cl.
| | |
|---|---|
| *H01L 29/78* | (2006.01) |
| *H01L 27/12* | (2006.01) |
| *H01L 29/786* | (2006.01) |
| *H01L 27/32* | (2006.01) |
| *G02F 1/1368* | (2006.01) |
| *G02F 1/1362* | (2006.01) |
| *G02F 1/1333* | (2006.01) |

(52) U.S. Cl.
CPC .......... *H01L 27/1248* (2013.01); *G02F 1/1368* (2013.01); *G02F 1/133345* (2013.01); *G02F 1/136227* (2013.01); *H01L 27/124* (2013.01); *H01L 27/3248* (2013.01); *H01L 27/3258* (2013.01); *H01L 27/3276* (2013.01); *H01L 29/7869* (2013.01); *H01L 29/78618* (2013.01)

(58) Field of Classification Search
CPC ..... H01L 29/7869; H01L 29/24; H01L 21/00; H01L 21/16; H01L 21/479
USPC .......................................................... 257/43
See application file for complete search history.

(56) References Cited

U.S. PATENT DOCUMENTS 8,339,533 B2 * 12/2012 Shin .................... G02F 1/13624
257/E33.053

FOREIGN PATENT DOCUMENTS

| CN | 1940688 A | 4/2007 |
|---|---|---|
| TW | 200915579 A | 4/2009 |
| TW | 201131777 A1 | 9/2011 |

* cited by examiner

*Primary Examiner* — Monica D Harrison
(74) *Attorney, Agent, or Firm* — Muncy, Geissler, Olds & Lowe, P.C.

(57) ABSTRACT

A display panel includes a TFT substrate, an opposite substrate and a display layer. A TFT of the TFT substrate has a drain. A first insulating layer has a first sub-layer and a second sub-layer disposed on the drain sequentially. The first sub-layer has a first opening with a first width. The second sub-layer has a second opening with a second width on the first opening. The first and second openings form a first via, and the second width is greater than the first width. A passivation layer is disposed on the first insulating layer. A second insulating layer is disposed on the passivation layer. A pixel electrode layer is disposed on the second insulating layer and disposed in the first via to connect the drain. The display layer is disposed between the TFT substrate and the opposite substrate.

20 Claims, 12 Drawing Sheets

DISPLAY PANEL AND DISPLAY DEVICE

CROSS REFERENCE TO RELATED APPLICATIONS

This Non-provisional application claims priority under 35 U.S.C. §119(a) on Patent Application No(s). 103106290 filed in Taiwan, Republic of China on Feb. 25, 2014, the entire contents of which are hereby incorporated by reference.

BACKGROUND OF THE INVENTION

1. Field of Invention

The invention relates to a display panel and a display device having the display panel.

2. Related Art

With the progress of technologies, flat display devices have been widely applied to various kinds of fields. Especially, liquid crystal display (LCD) devices, having advantages such as compact structure, low power consumption, less weight and less radiation, gradually take the place of cathode ray tube (CRT) display devices, and are widely applied to various electronic products, such as mobile phones, portable multimedia devices, notebooks, LCD TVs and LCD screens.

A conventional LCD device includes a thin film transistor (TFT) substrate, and the TFT substrate includes a TFT and a pixel electrode which are both disposed on a substrate. In the manufacturing process, a via needs to be formed by etching the portion over the drain of the TFT and a transparent conductive layer is disposed on the inner wall of the via to electrically connect the drain of the TFT and the pixel electrode. Besides, the gate of the TFT is electrically connected with a scan line and the source of the TFT is electrically connected with a data line. When the scan line inputs a scan signal to the gate of the TFT, the TFT is controlled so that the data voltage of the data line can be inputted to the pixel electrode through the source, the drain and the transparent conductive layer, and thereby the orientation of the liquid crystal can be controlled for the image display.

Moreover, the conventional polycrystalline TFT has a carrier mobility of about 100 $cm^2/Vs$. However, it needs to be made under the environment of over 450° C., so it only can be formed on the substrate with high heat resistance and is not suitable for the application of large-size or flexible substrate. Besides, although the conventional amorphous TFT can be formed under the environment of lower temperature, e.g. about 300° C., this kind of amorphous TFT only has carrier mobility of about 1 $cm^2/Vs$, so it can't be applied to the panel requiring high fineness. Therefore, it has been presented that the metal oxide semiconductor, such as indium gallium zinc oxide (IGZO), can be used as the channel layer of the TFT.

Although IGZO TFT has more excellent carrier mobility than the amorphous TFT and the process thereof is easier than the process of the polycrystalline TFT, IGZO TFT is very sensitive to the light, water and oxygen.

For protecting the channel layer of the TFT, a protection layer (such as silicon oxide) is disposed on the channel layer of metal oxide semiconductor to protect the channel layer in the conventional art. FIG. 1A is a schematic diagram showing the electric characteristic curve of the TFT when a protection layer is disposed on the channel layer of metal oxide semiconductor. Although the protection layer has been disposed to protect the channel layer, after a period of time (or after a heat treatment), as shown in FIG. 1B, the characteristic curve of the TFT still deviates from the curve in FIG. 1A. Therefore, the efficiency of the TFT will be reduced and the display quality of the display panel and display device will be thus affected.

Therefore, it is an important subject to provide a display panel and a display device which include stable TFT efficiency so as to have a stable display quality.

SUMMARY OF THE INVENTION

In view of the foregoing subject, an objective of the invention is to provide a display panel and a display device which include stable TFT efficiency so as to have a stable display quality.

To achieve the above objective, a display panel according to the invention comprises a TFT substrate, an opposite substrate and a display layer. The TFT substrate includes a substrate, a thin film transistor, a first insulating layer, a passivation layer, a second insulating layer and a pixel electrode layer. The thin film transistor is disposed on the substrate and has a drain. The first insulating layer includes a first sub-layer and a second sub-layer disposed on the drain sequentially. The first sub-layer has a first opening with a first width, and the second sub-layer has a second opening with a second width on the first opening. The first opening and the second opening form a first via, and the second width is greater than the first width. The passivation layer is disposed on the first insulating layer, the second insulating layer is disposed on the passivation layer, and the pixel electrode layer is disposed on the second insulating layer and disposed in the first via to connect the drain. The display layer is disposed between the TFT substrate and the opposite substrate.

To achieve the above objective, a display device according to the invention comprises a TFT substrate, an opposite substrate, a display layer and a backlight module. The TFT substrate includes a substrate, a thin film transistor, a first insulating layer, a passivation layer, a second insulating layer and a pixel electrode layer. The thin film transistor is disposed on the substrate and has a drain. The first insulating layer includes a first sub-layer and a second sub-layer disposed on the drain sequentially. The first sub-layer has a first opening with a first width, and the second sub-layer has a second opening with a second width on the first opening. The first opening and the second opening form a first via, and the second width is greater than the first width. The passivation layer is disposed on the first insulating layer, the second insulating layer is disposed on the passivation layer, and the pixel electrode layer is disposed on the second insulating layer and disposed in the first via to connect the drain. The display layer is disposed between the TFT substrate and the opposite substrate. The backlight module is disposed on the side of the TFT substrate away from the opposite substrate.

As mentioned above, in the display panel and display device of the invention, the first insulating layer of the TFT substrate includes a first sub-layer and a second sub-layer disposed on the drain of the TFT sequentially. The first sub-layer has a first opening having a first width. The second sub-layer has a second opening having a second width on the first opening. The first opening and the second opening can form a first via, and the second width can be greater than the first width. The pixel electrode layer of the TFT substrate is disposed on the second insulating layer and disposed in the first via to connect the drain. In comparison with the conventional art, by the first sub-layer and second sub-layer sequentially disposed on the drain of the TFT, the efficiency of the TFT can be kept stable after a period of time of the operation and therefore the display quality of the display panel and display device won't be affected.

Besides, in an embodiment of the invention, the projections of the first via formed by the first opening and the second opening and the second via of the passivation layer on the substrate of the TFT substrate overlap each other, and the area of the overlap can be between 4 μm² and 49 μm². Thereby, in comparison with the conventional art where another via is formed by etching the greater via, the area of the overlap of the first via and the second via can be less than that of the via of the conventional art, and the alignment issue between the greater via and the another via in the greater via will be avoided. Moreover, since the area of the overlap is less than that of the via of the conventional art, the black matrix disposed on the scan line will have a less covering width than the conventional art and the pixel aperture of the display panel and display device can be thus increased.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

The display panel of an embodiment of the invention is an active matrix LCD panel and includes a TFT substrate 1. As below, the structure of the TFT substrate 1 is illustrated first.

Figure 2A:
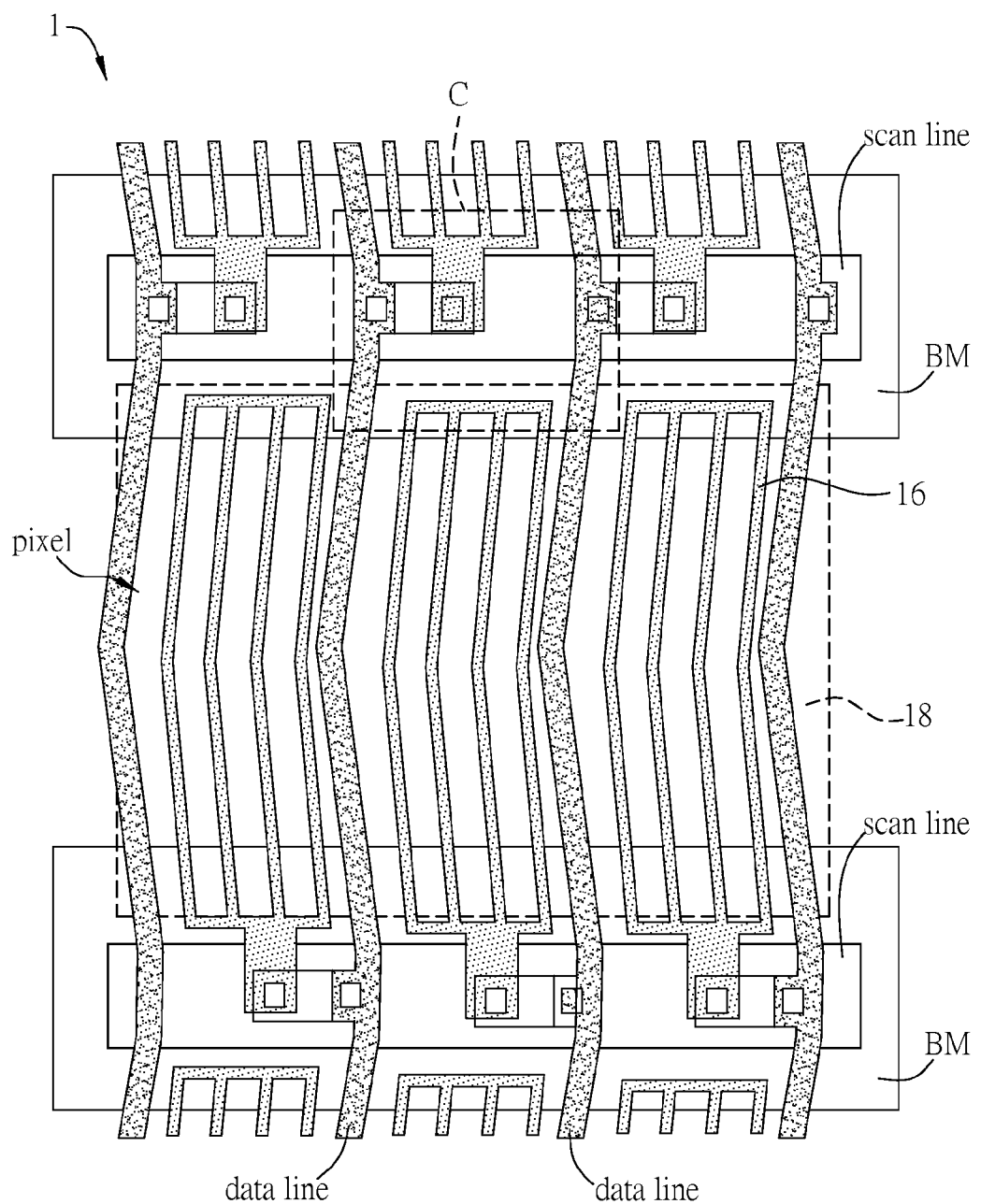
FIG. 2A is a schematic top-view diagram of a TFT substrate of an embodiment of the invention.
Figure 2B:
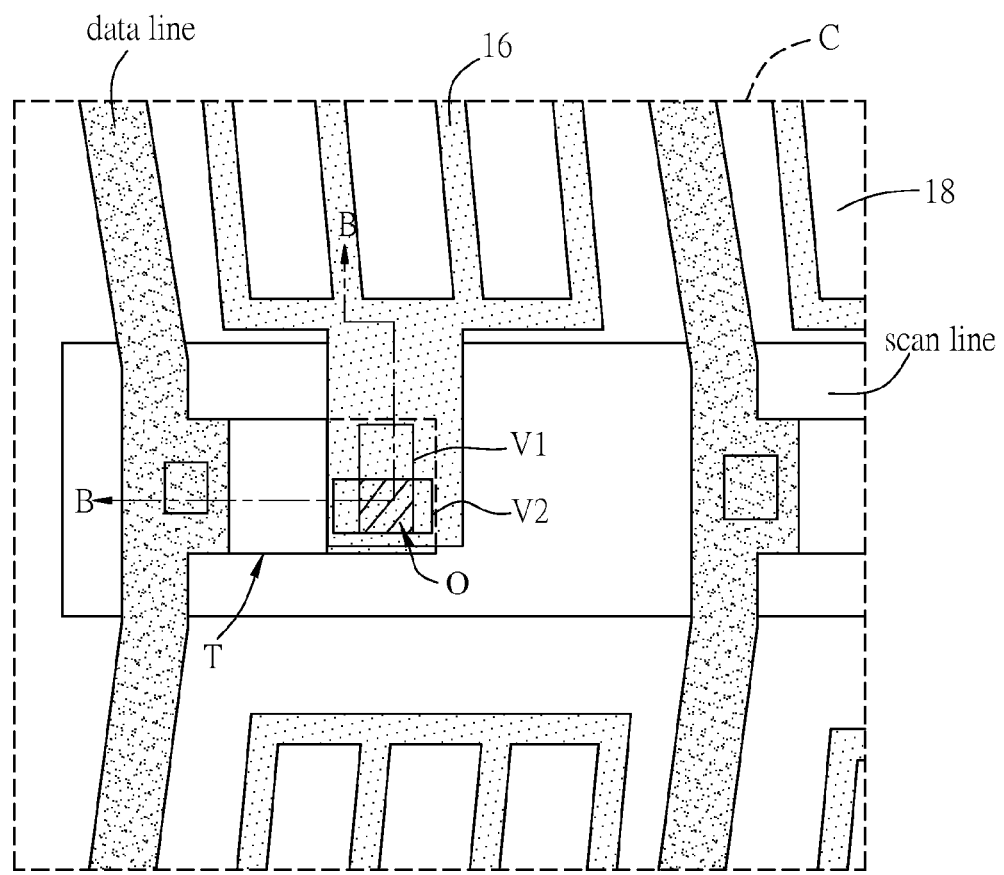
FIG. 2B is a schematic enlarged diagram of the region C in FIG. 2A.
Figure 2C:
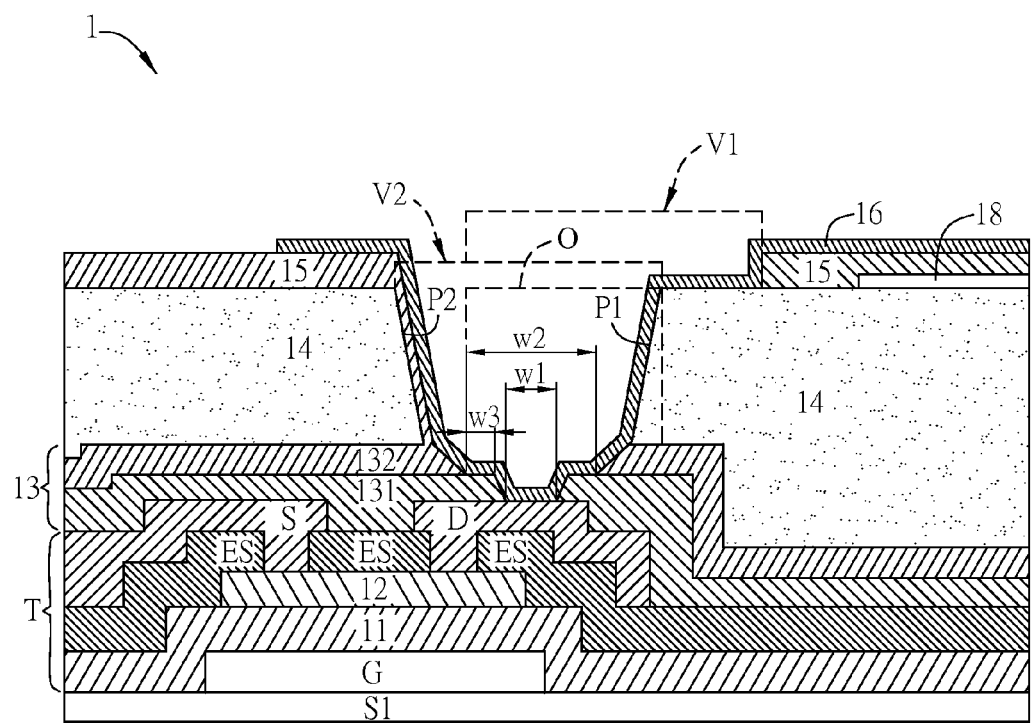
FIG. 2C is a schematic sectional diagram taken along the line B-B in FIG. 2B.
Figure 2D:
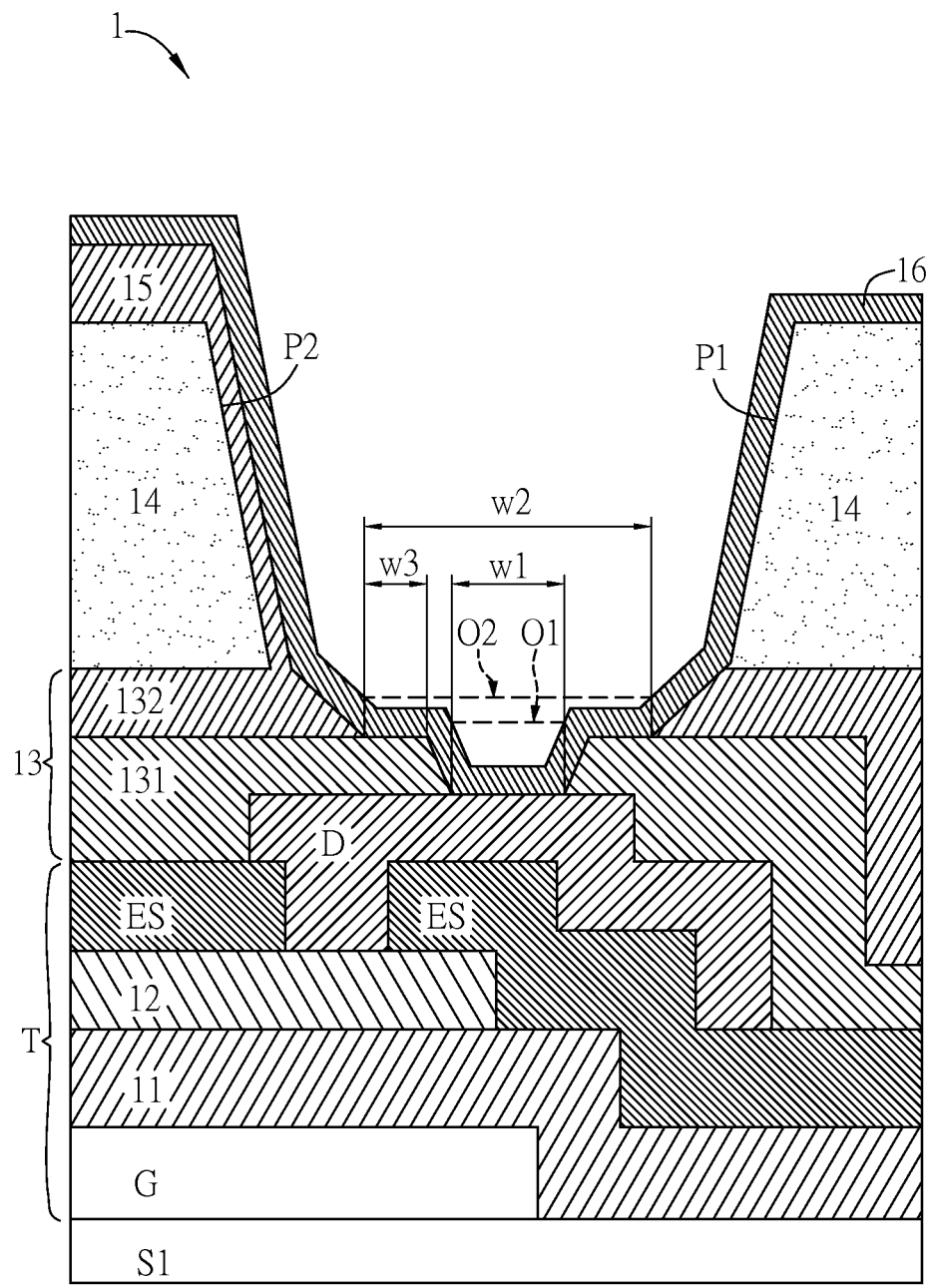
FIG. 2D is a schematic enlarged diagram of a part of FIG. 2C.

FIG. 2A is a schematic top-view diagram of the TFT substrate 1, FIG. 2B is a schematic enlarged diagram of the region C in FIG. 2A, FIG. 2C is a schematic sectional diagram taken along the line B-B in FIG. 2B, and FIG. 2D is a schematic enlarged diagram of a part of FIG. 2C. To be noted, for the convenient illustration, the size relation (e.g. ratio) of the height and width of each element shown in FIGS. 2A to 2D is just for the illustrative purpose but not for representing the real one.

As shown in FIG. 2A, the TFT substrate 1 can include a plurality of scan lines, a plurality of data lines and a plurality of pixels (only two scan lines and four data lines are shown in FIG. 2A). The scan lines and the data lines can cross each other to form the pixel array. The scan lines can be turned on by receiving a scan signal each, and the data signals can be transmitted to the pixels through the data lines so that the display panel can display images. In FIG. 2A, the data line is shown as a bent line, but it can be a straight line or has other shapes in other layouts. Moreover, the TFT substrate 1 can further include a black matrix BM, which is disposed over the scan line to cover the area of the scan line and prevent the light leakage of the pixel. Of course, the black matrix BM also can be disposed on an opposite substrate of the LCD panel. Herein for example, the black matrix BM is disposed on the TFT substrate 1.

As shown in FIG. 2C, the TFT substrate 1 includes a substrate S1, a thin film transistor T, a first insulating layer 13 (shown in FIG. 2D), a passivation layer 14, a second insulating layer 15, a pixel electrode layer 16 and a common electrode layer 18.

The TFT T is disposed on the substrate S1. In an embodiment, the substrate S1 can be formed by a transparent material, such as glass, quartz or the like, plastic material, rubber, fiberglass or other polymer materials, for being applied to the transparent display device. Favorably, the substrate S1 can be an alumino silicate glass substrate. The substrate S1 also can be formed by an opaque material for being applied to the self-luminous or reflective display device, and can be a metal-fiberglass composite plate or a metal-ceramic composite plate for example.

The TFT T of this embodiment includes a gate G, a gate dielectric layer 11, a channel layer 12, a source S and a drain D. The gate G is disposed on the substrate S1 and can be a single-layer or multi-layer structure formed by metal (e.g. aluminum, copper, silver, molybdenum, or titanium) or alloy. A part of the wires, such as scan lines, for transmitting driving signals can be the same layer as the gate G and formed in the same process as the gate G, and they can be electrically connected to each other. the gate dielectric layer 11 is disposed on the gate G and can be a multi-layer structure formed by an organic material (such as organic silicon/oxide compound), an inorganic material (such as silicon nitride, silicon oxide, silicon oxynitride, silicon carbide, aluminum oxide, hafnium oxide), or their any combination. The gate dielectric layer 11 needs to completely cover the gate G and can partially or totally cover the substrate S1.

The channel layer 12 is disposed on the gate dielectric layer 11 and opposite to the gate G. In an embodiment, the channel layer 12 can include a oxide semiconductor for example. The said oxide semiconductor includes an oxide and the oxide includes one of indium, gallium, zinc and tin. For example, the oxide semiconductor is indium gallium zinc oxide (IGZO).

The source S and the drain D are disposed on the channel layer 12 and contact the channel layer 12. When the channel layer 12 of the TFT T is not turned on, the source S and the drain D are electrically separated from each other. The source S and the drain D can be a single-layer or multi-layer structure formed by metal (e.g. aluminum, copper, silver, molybdenum, or titanium) or alloy. Besides, A part of the wires, such as data lines, for transmitting driving signals can be the same layer as the source S and drain D and formed in the same process as the source S and drain D.

Figure 2E:
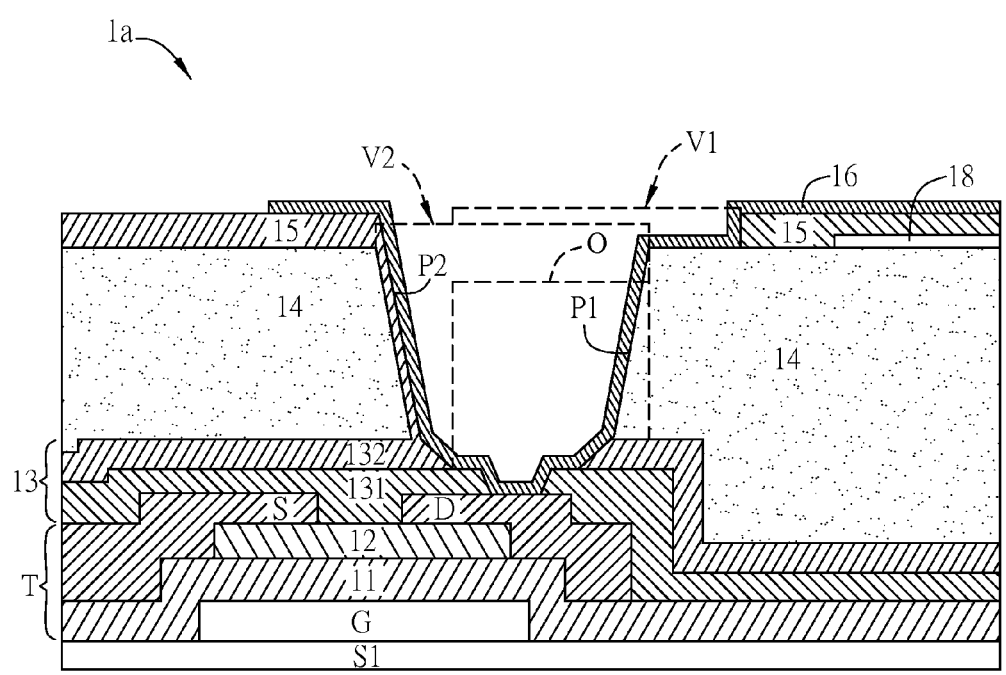
FIG. 2E is a schematic sectional diagram of a TFT substrate of another embodiment of the invention.

To be noted, the source S and the drain D of the TFT T of this embodiment are disposed on an etch stop layer ES, and one end of each of the source S and the drain D can contact the channel layer 12 through the opening of the etch stop layer ES. The etch stop layer ES can be a single-layer or multi-layer structure formed by an organic material (such as organic silicon/oxide compound), an inorganic material (such as silicon nitride, silicon oxide, silicon oxynitride, silicon carbide, aluminum oxide, hafnium oxide), or their any combination. However, in other embodiments, as shown in FIG. 2E, the source S and the drain D also can be directly disposed on the channel layer 12 without the etch stop layer ES.

As shown in FIGS. 2B to 2D, the first insulating layer 13 includes a first sub-layer 131 and a second sub-layer 132, and the first sub-layer 131 and the second sub-layer 132 are disposed on the drain D sequentially and cover at least a part of the drain D. Herein, the first sub-layer 131 is disposed on the drain D and includes a first opening O1 having a first width w1, and the second sub-layer 132 includes a second opening O2 having a second width w2 and disposed on the first opening O1. The first opening O1 and the second opening O2 can form a first via V1, and the second width w2 is greater than the first width w1. In other words, because the second opening O2 of the second sub-layer 132 is greater than the first opening O2 of the first sub-layer 131, the first via V1 of the first insulating layer 13 (the first sub-layer 131 and the second sub-layer 132) has a stepped shape.

The first sub-layer 131 and the second sub-layer 132 can be formed with a deposition rate less than 3 Å/s for example. The material of the first sub-layer 131 can include SiOx or SiNx. Herein for example, the material of the first sub-layer 131 is SiO2, and the thickness of the first sub-layer 131 is between 1000 Å and 3000 Å (1000 Å≤thickness≤3000 Å) and favorably is 1000 Å. Moreover, the material of the second sub-layer 132 can include SiNx or AlxOx. Herein for example, the material of the second sub-layer 132 is SiNx, and the thickness of the second sub-layer 132 is between 100 Å and 2000 Å (100 Å≤thickness≤2000 Å) and favorably is between 300 Å and 500 Å.

In an embodiment, the openings O1, O2 can be formed in the first sub-layer 131 and the second sub-layer 132 by the etch process. Since the second sub-layer 132 (SiNx) is etched with a more amount and the first sub-layer 131 (SiOx) is etched with a less amount, the first via V1 has a stepped shape. In this embodiment, the first sub-layer 131 has an inclined surface and the second sub-layer 132 also has an inclined surface. Besides, the first width w1 of the first sub-layer 131 is the least one of the width of the first opening O1, and the second width w2 of the second sub-layer 132 is also the least one of the width of the second opening O2. Moreover, the distance w3 between the edges of the first and second sub-layers 131 and 132 on the same side can be between 0.1 μm and 0.5 μm (0.1 μm≤distance w3≤0.5 μm) for example.

The passivation layer 14 is disposed on the first insulating layer 13 and has a second via V2 disposed over the drain D. The first via V1 and the second via V2 can have the same or different size. Herein for example, the top view of each of the first and second vias V1 and V2 has a rectangular shape. The first via V1 and the second via V2 partially overlap each other to form an overlap O. In other words, the projections of the first via V1 formed by the first and second openings O1 and O2 and the second via V2 of the passivation layer 14 on the substrate S1 of the TFT substrate 1 at least partially overlap each other, and the area of the overlap O can be between 4 μm$^2$ and 49 μm$^2$.

The ratio of the area of the overlap O of the first and second vias V1 and V2 to the area of the first via V1 can be between 0.14 and 0.78, and the ratio of the area of the overlap O of the first and second vias V1 and V2 to the area of the second via V2 also can be between 0.14 and 0.78. Herein, the said area can refer to the sectional area or the projected area. For example, the area of the overlap O is 9 μm$^2$ and the area of the first via V1 is 36 μm$^2$. In comparison with the conventional art where another via is formed by etching the greater via, the area of the overlap O of the first and second vias V1 and V2 is less than that of the via of the conventional art, and the alignment issue between the greater via and the another via in the greater via will be avoided. Moreover, since the area of the overlap O is less than that of the via of the conventional art, the black matrix BM disposed on the scan line will have a less covering width than the conventional art and the pixel aperture of the display panel can be thus increased. To be noted, the size of the overlap O between the first and second vias V1 and V2 can be between 2 μm and 8 μm for favoring the following process.

As below, the manufacturing method of the via of FIG. 2C will be illustrated by referring to FIGS. 3A to 3D.

Figure 3A:
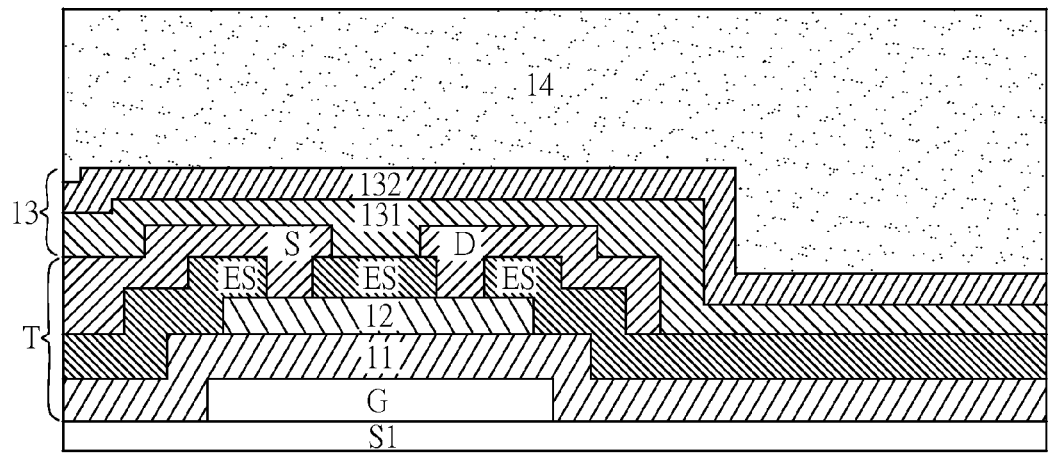
FIGS. 3A to 3D are schematic diagrams of the manufacturing method of the via in FIG. 2C.

First, as shown in FIG. 3A, the first insulating layer 13 and the passivation layer 14 are sequentially deposited on the source S and drain D. The first insulating layer 13 includes a first sub-layer 131 and a second sub-layer 132.

Figure 3B:
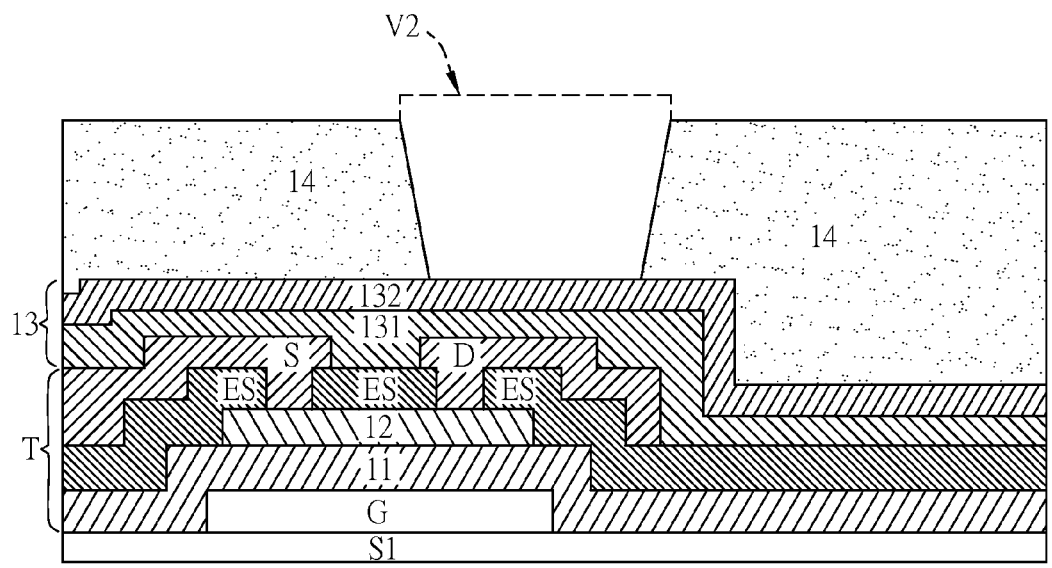

As shown in FIG. 3B, the second via V2 is formed in the passivation layer 14 to expose the first insulating layer 13 by a photolithography process implemented with a photomask (not shown).

Figure 3C:
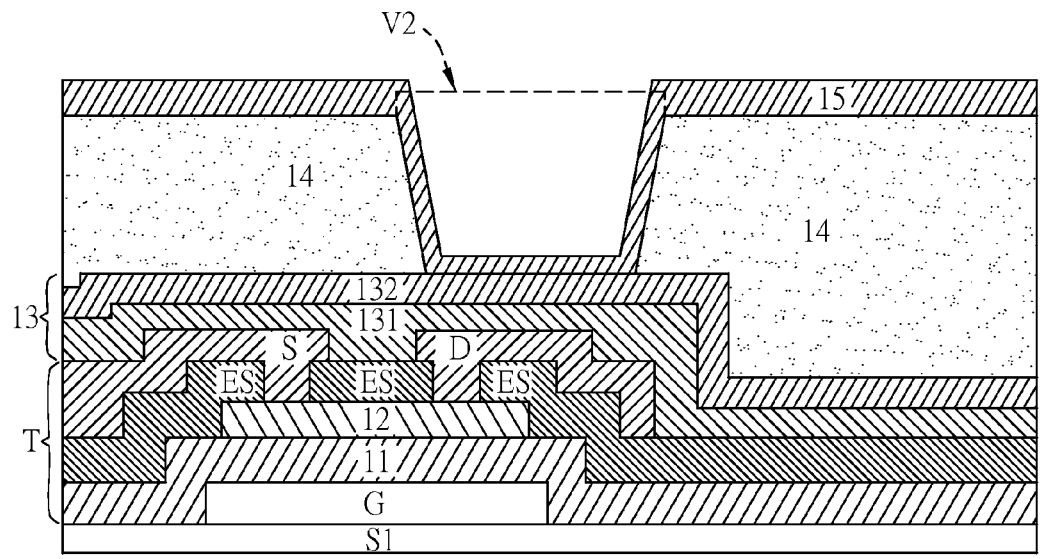

Then, as shown in FIG. 3C, the second insulating layer 15 is formed to cover the first insulating layer 13 and the passivation layer 14.

Figure 3D:
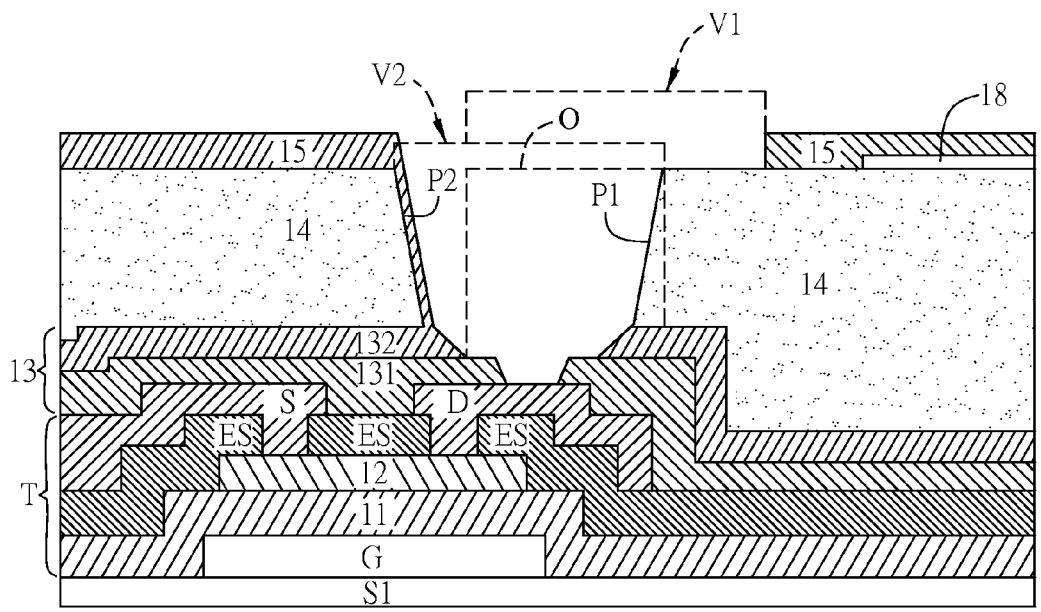

Then, as shown in FIG. 3D, a photolithography process is implemented with a photomask to the second insulating layer 15 and the first insulating layer 13 to form the first via V1 to expose the drain D.

Each of the first via V1 and the second via V2 can have a polygonal, circular, elliptic or irregular shape. The favorable case for the overlap between the first and second vias V1 and V2 is that the first and second vias V1 and V2 are both rectangular and the overlap O between them is located centrally. Hence, the alignment issue between the greater via and the less via in the greater via occurring in the conventional art can be avoided, so that the electric condition of the transparent conductive layer won't be affected in the following process (if the alignment is bad, the position of the transparent conductive layer may be affected and the electrical connection between the drain and the pixel electrode will be thus affected).

As shown in FIG. 2C, the second insulating layer 15 is disposed on the passivation layer 14 and the pixel electrode layer 16 is disposed on the second insulating layer 15. Herein, the pixel electrode layer 16 is comb-shaped. Moreover, the pixel electrode layer 16 is partially disposed in the first and second vias V1 and V2 formed by the first and second openings O1 and O2 and can electrically connect to the drain D through the overlap O between the first and second vias V1 and V2. The material of the pixel electrode layer 16 can be, for example, ITO, IZO, AZO, CTO, SnO2 or ZnO.

To be noted, when the insulating layer is etched in the conventional art, the side wall of the via is easily made with a right angle or chamfering angle resulting in the sectional difference. Therefore, the transparent conductive layer is easily cut off when being disposed in the via, and the yield will be thus affected. However, a part of the pixel electrode layer 16 disposed in the overlap O between the first and second vias V1 and V2 is located on the first side wall P1 (the right side wall of the via in FIG. 2C) and directly contacts the passivation layer 14. Besides, a part of the second insulating layer 15 disposed in the overlap O between the first and second vias V1 and V2 is located on the second side wall P2 (the left side wall of the via in FIG. 2C) and directly contacts the passivation layer 14. The part of the second insulating layer 15 on the second side wall P2 can connect the parts of the insulating layer over and under the passivation layer 14 (the second insulating layer 15 and the second sub-layer 132), so the sectional difference herein can be less than the conventional art. Besides, because the passivation layer 14 is more gradual after etched and there are two different stacks on the two side walls, the probability that the pixel electrode layer 16 is cut off will become lower and the yield of the process can be thus enhanced.

Figure 4:
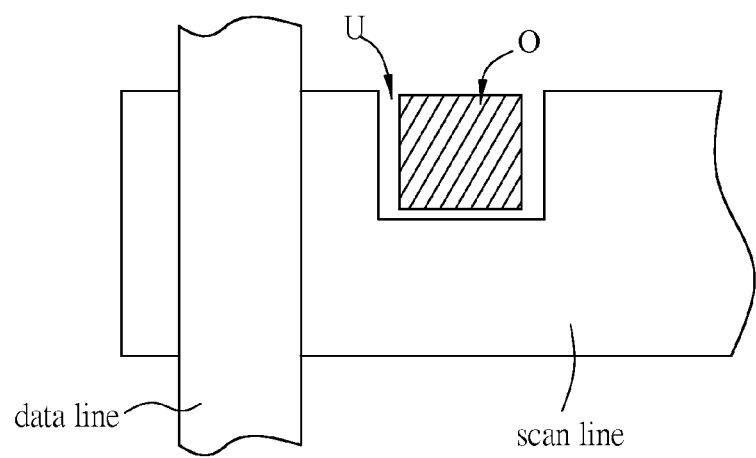
FIG. 4 is a schematic diagram of the relation among the data line, the scan line and the overlap.

The common electrode layer 18 is disposed between the passivation layer 14 and the second insulating layer 15. In other embodiments, as shown in FIG. 4, since the area of the overlap O between the first and second vias V1 and V2 is less than that of the via of the conventional art, an indentation U of the scan line can be formed (the portion of the scan line corresponding to the indentation U is hollowed) and disposed at the overlap O between the first and second vias V1 and V2 correspondingly (only the overlap O between the first and second vias V1 and V2 is shown in FIG. 4 but the top views of the first and second vias V1 and V2 are not shown). As mentioned above, since the area of the overlap O between the first and second vias V1 and V2 is less than that of the via of the conventional art, the indentation U of the scan line won't be too large to cut off the scan line, but the portion of the scan line having the indentation U has a less line width so that the coupling capacitance between the scan line and the data line can be reduced.

Figure 5A:
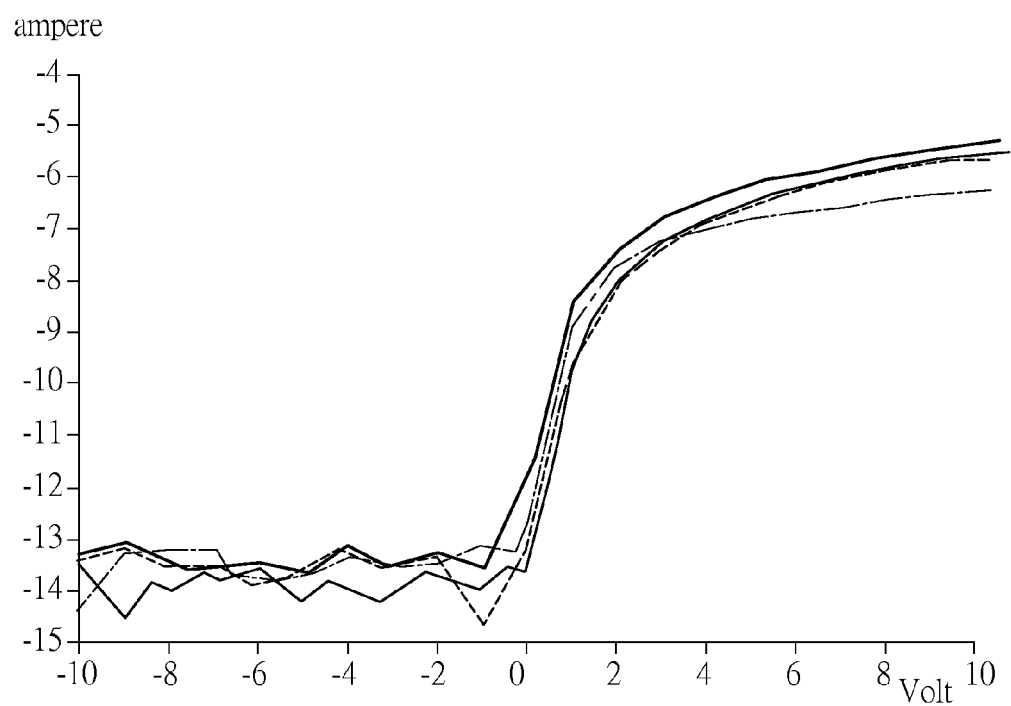
FIG. 5A is a schematic diagram of the electric characteristic curve of the TFT when the first and second sub-layers are disposed on the channel layer of the TFT of the TFT substrate of an embodiment of the invention.
Figure 5B:
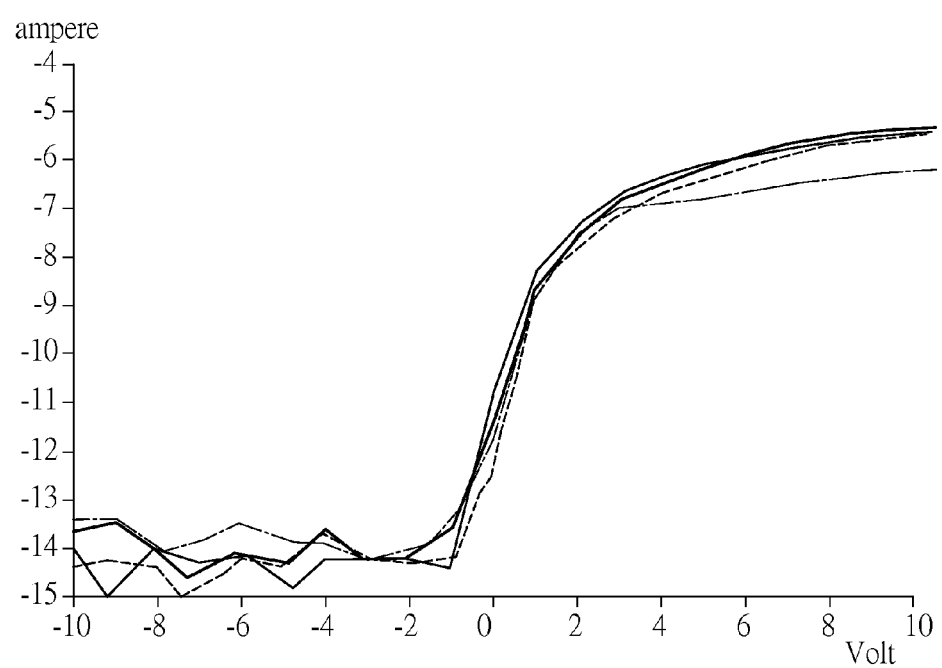
FIG. 5B is a schematic diagram of the electric characteristic curve of the TFT of the TFT substrate in FIG. 5A operated for a period of time.

FIG. 5A is a schematic diagram of the electric characteristic curve of the TFT T when the first and second sub-layers 131 and 132 are disposed on the channel layer 12 of the TFT T of the TFT substrate 1 of an embodiment of the invention, FIG. 5B is a schematic diagram of the electric characteristic curve of the TFT T of the TFT substrate 1 in FIG. 5A operated for a period of time. FIGS. 5A and 5B show four different characteristic curves which are acquired by using four different measuring conditions.

Figure 1A:
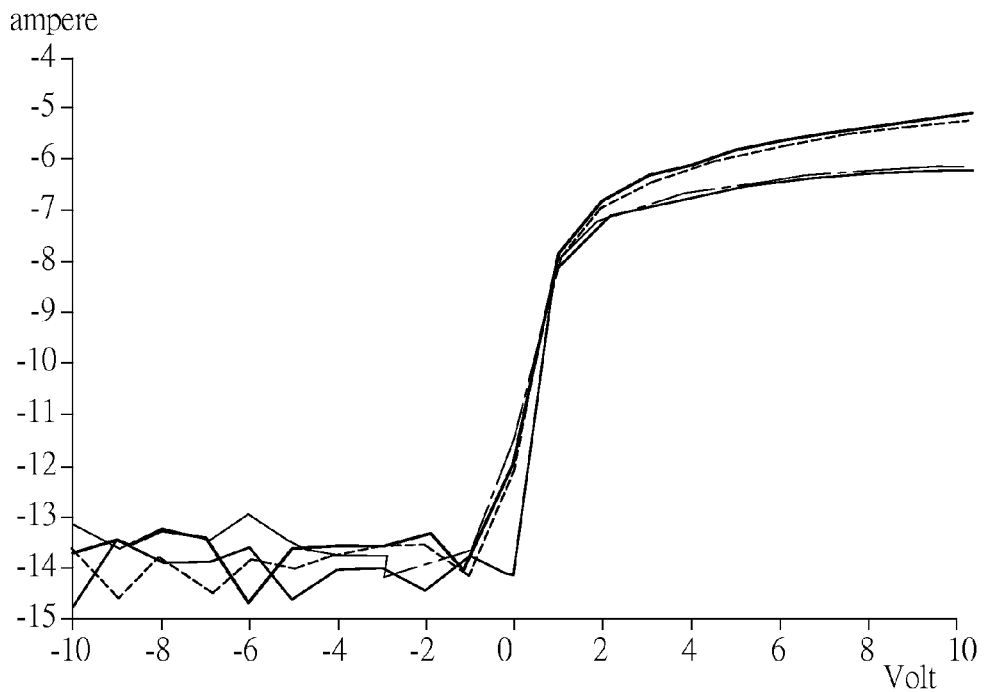
FIG. 1A is a schematic diagram showing the electric characteristic curve of the TFT when a protection layer is disposed on the channel layer of the TFT in a conventional TFT substrate.
Figure 1B:
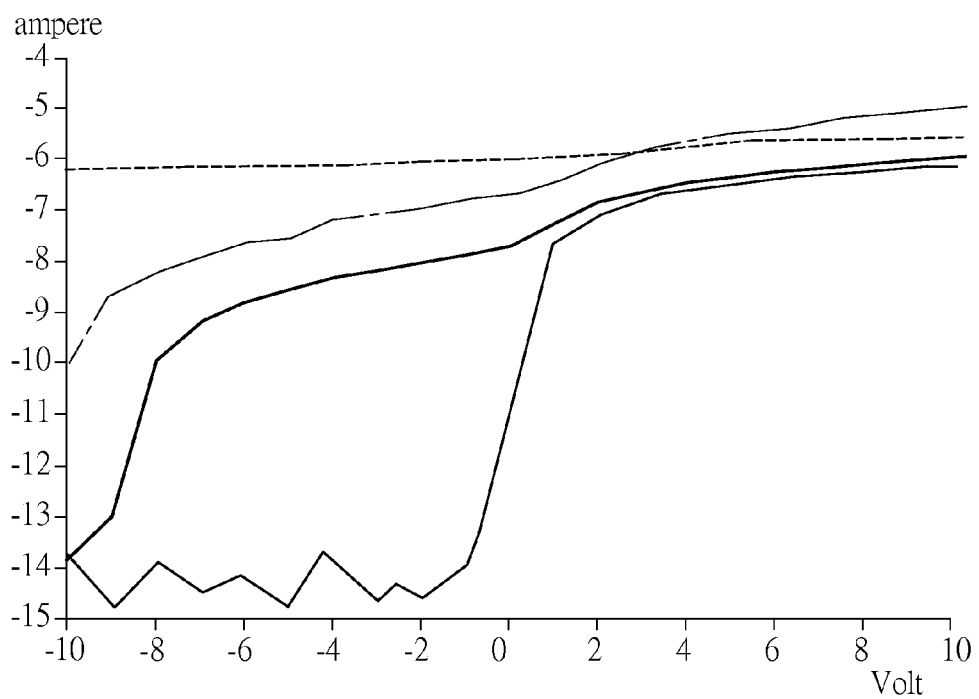
FIG. 1B is a schematic diagram of the electric characteristic curve of the TFT of the TFT substrate in FIG. 1A after a period of time of the operation.

As shown in FIGS. 5A and 5B, after a period of time, the curve variation of FIG. 5B is much less than that of FIG. 1B by the disposition of the first and second sub-layers 131 and 132. The difference between the curve trends of FIGS. 5A and 5B is not too much. In other words, by that the first sub-layer 131 and the second sub-layer 132 are sequentially disposed on the drain D and the channel layer 12 of the TFT T, the efficiency of the TFT T can be stable and therefore the display quality of the display panel and display device won't be affected.

Figure 6:
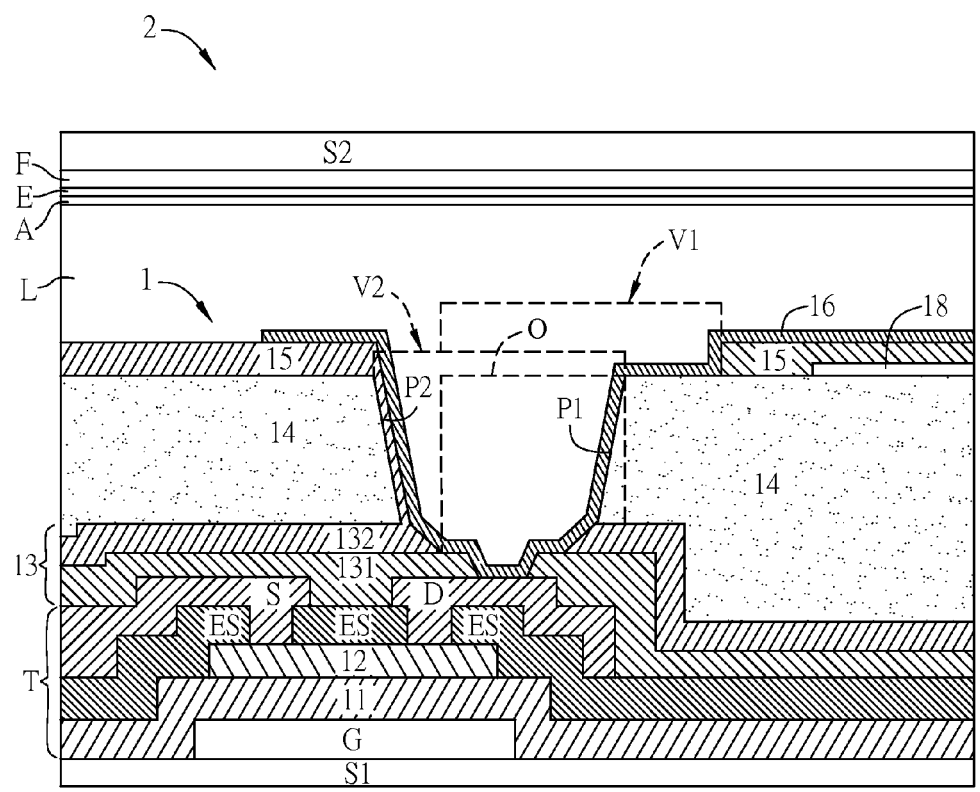
FIG. 6 is a schematic sectional diagram of a display panel of an embodiment of the invention.

FIG. 6 is a schematic sectional diagram of a display panel 2 of an embodiment of the invention.

As shown in FIG. 6, the display panel 2 includes a TFT substrate 1, an opposite substrate S2 and a display layer L.

The opposite substrate S2 is disposed opposite to the TFT substrate 1 and can optionally include an electrode layer E and an alignment film A. The opposite substrate S2 can be formed by a transparent material, such as glass, quartz or the like. In an embodiment, the substrate S1 of the TFT substrate 1 and the opposite substrate S2 may have different material. For example, the opposite substrate S2 is a potash glass substrate and the substrate S1 is an alumino silicate glass substrate. The electrode layer E is disposed on the side of the opposite substrate S2 facing the TFT substrate 1, and the alignment film A is disposed below the electrode layer E. Moreover, a color filter sheet F can be disposed between the opposite substrate S2 and the electrode layer E and used for the colorful display. Besides, the display layer L is disposed between the TFT substrate 1 and the opposite substrate S2 and can be a liquid crystal layer or an organic light-emitting layer. Since the TFT substrate 1 has been clearly illustrated in the above description, its illustration is omitted here for conciseness. Of course, the TFT substrate 1 can be replaced by the TFT substrate 1a of FIG. 2E.

Figure 7:
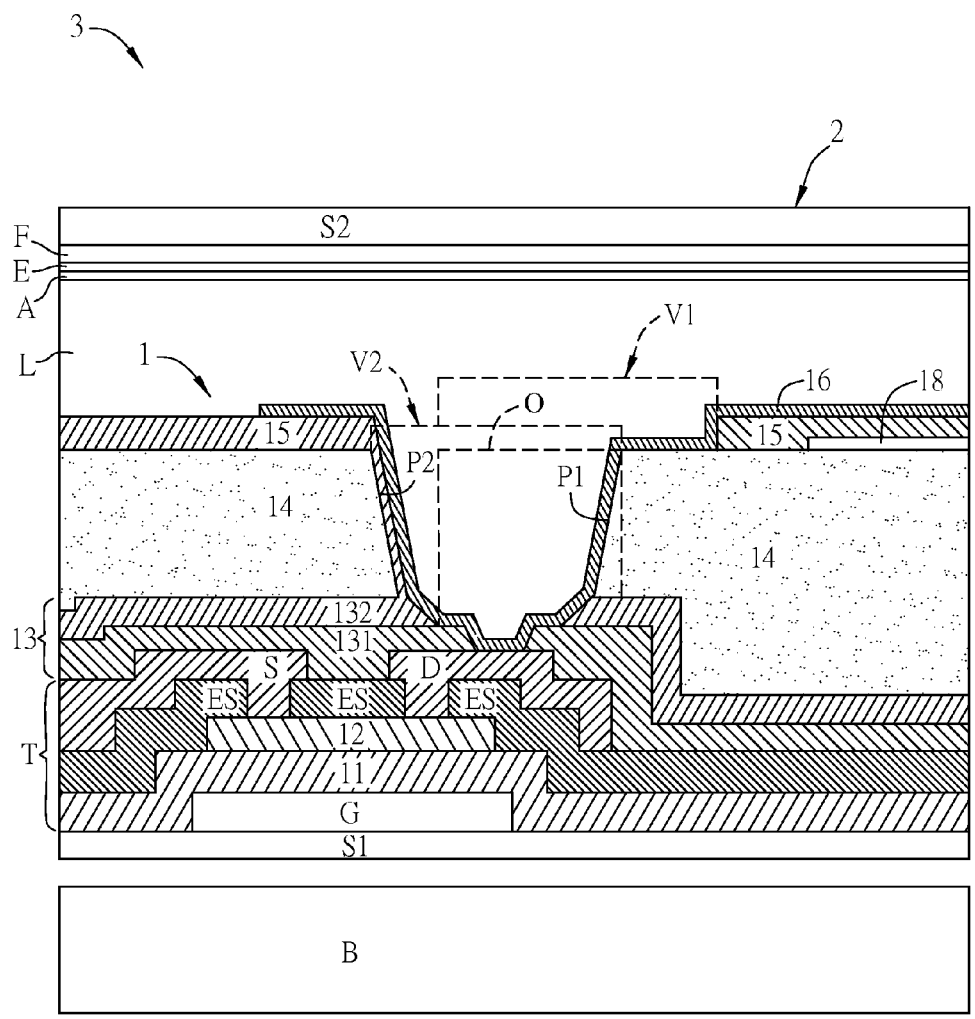
FIG. 7 is a schematic sectional diagram of a display device of an embodiment of the invention.

FIG. 7 is a schematic sectional diagram of a display device 3 of an embodiment of the invention.

The display device 3 includes a display panel 2 and a backlight module B. The display panel 2 includes a TFT substrate 1, an opposite substrate S2 and a display layer L. Since the TFT substrate 1 has been clearly illustrated in the above description, its illustration is omitted here for conciseness.

The opposite substrate S2 is disposed opposite to the TFT substrate 1 and can optionally include an electrode layer E and an alignment film A. The opposite substrate S2 can be formed by a transparent material, such as glass, quartz or the like. In an embodiment, the substrate S1 of the TFT substrate 1 and the opposite substrate S2 may have different material. For example, the opposite substrate S2 is a potash glass substrate and the substrate S1 is an alumino silicate glass substrate. The electrode layer E is disposed on the side of the opposite substrate S2 facing the TFT substrate 1, and the alignment film A is disposed below the electrode layer E. Moreover, a color filter sheet F can be disposed between the opposite substrate S2 and the electrode layer E and used for the colorful display. Besides, the display layer L is disposed between the TFT substrate 1 and the opposite substrate S2. To be noted, the source S and the drain D of the TFT T in FIGS. 6 and 7 are disposed on an etch stop layer ES, and one end of each of the source S and the drain D contacts the channel layer 12 through the opening of the etch stop layer ES. The etch stop layer ES can be a single-layer or multi-layer structure formed by an organic material (such as organic silicon/oxide compound), an inorganic material (such as silicon nitride, silicon oxide, silicon oxynitride, silicon carbide, aluminum oxide, hafnium oxide), or their any combination. However, in other embodiments, the source S and the drain D also can be directly disposed on the channel layer 12 and contact the channel layer 12.

Moreover, the backlight module B is disposed on the side of the TFT substrate 1 away from the opposite substrate S2 and emits light, and therefore the light passes through the substrate S1 of the TFT substrate 1 and the display layer L and then is outputted from the opposite substrate S2. To be noted, in this embodiment, the display layer L is a liquid crystal layer so it works with the backlight module B. If the display layer L is an organic light-emitting layer, the backlight module B can be removed.

Summarily, in the display panel and display device of the invention, the first insulating layer of the TFT substrate includes a first sub-layer and a second sub-layer disposed on the drain of the TFT sequentially. The first sub-layer has a first opening having a first width. The second sub-layer has a second opening having a second width on the first opening. The first and second openings can form a first via, and the second width can be greater than the first width. The pixel electrode layer of the TFT substrate is disposed on the second insulating layer and disposed in the first via to connect the drain. In comparison with the conventional art, by the first sub-layer and second sub-layer sequentially disposed on the drain of the TFT, the efficiency of the TFT can be kept stable after a period of the operation and therefore the display quality of the display panel and display device won't be affected.

Besides, in an embodiment of the invention, the projections of the first via formed by the first and second openings and the second via of the passivation layer on the substrate of the TFT substrate overlap each other, and the area of the overlap can be between 4 $\mu m^2$ and 49 $\mu m^2$. Thereby, in comparison with the conventional art where another via is formed by etching the greater via, the area of the overlap of the first and second vias can be less than that of the via of the conventional art, and the alignment issue between the greater via and the another via in the greater via will be avoided. Moreover, since the area of the overlap is less than that of the via of the conventional art, the black matrix disposed on the scan line will have a less covering width than the conventional art and the pixel aperture of the display panel and display device can be thus increased.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display panel, comprising:
   a TFT substrate, including:
      a substrate;
      a thin film transistor disposed on the substrate and having a drain;
      a first insulating layer including a first sub-layer and a second sub-layer disposed on the drain sequentially, wherein the first sub-layer has a first opening with a first width, the second sub-layer has a second opening with a second width on the first opening, the first opening and the second opening form a first via, and the second width is greater than the first width;
      a passivation layer disposed on the first insulating layer;
      a second insulating layer disposed on the passivation layer; and
      a pixel electrode layer disposed on the second insulating layer and disposed in the first via to connect the drain;
   an opposite substrate; and
   a display layer disposed between the TFT substrate and the opposite substrate.

2. The display panel as recited in claim 1, wherein the material of the second sub-layer is SiNx or AlxOx.

3. The display panel as recited in claim 1, wherein the thickness of the second sub-layer is between 100 Å and 2000 Å.

4. The display panel as recited in claim 1, wherein the passivation layer has a second via disposed over the drain, the first via and the second via partially overlap each other to form an overlap, and the area of the overlap is less than that of the first via.

5. The display panel as recited in claim 4, wherein the pixel electrode layer is further disposed in the overlap to connect the drain, and the size of the overlap is between 2 $\mu m$ and 8 $\mu m$.

6. The display panel as recited in claim 4, wherein the ratio of the area of the overlap to the area of the first via is between 0.14 and 0.78.

7. The display panel as recited in claim 4, wherein the thin film transistor further has a scan line, the scan line has an indentation and the indentation is disposed corresponding to the overlap.

8. The display panel as recited in claim 4, wherein the overlap has a first side wall, and a part of the pixel electrode layer disposed in the overlap is located on the first side wall and directly contacts the passivation layer.

9. The display panel as recited in claim 8, wherein the overlap further has a second side wall, and a part of the second insulating layer disposed in the overlap is located on the second side wall and directly contacts the passivation layer.

10. The display panel as recited in claim 1, wherein the first material of the first sub-layer is SiOx.

11. The display panel as recited in claim 1, wherein the distance between the edges of the first sub-layer and the second sub-layer on the same side is between 0.1 $\mu m$ and 0.5 $\mu m$.

12. The display panel as recited in claim 11, wherein the material of the channel layer is an oxide semiconductor.

13. A display device, comprising:
   a TFT substrate including a substrate, a thin film transistor, a first insulating layer, a passivation layer, a second insulating layer and a pixel electrode layer, wherein the thin film transistor is disposed on the substrate and has a drain, the first insulating layer includes a first sub-layer and a second sub-layer disposed on the drain sequentially, the first sub-layer has a first opening with a first width, the second sub-layer has a second opening with a second width on the first opening, the first opening and the second opening form a first via, and the second width is greater than the first width, the passivation layer is disposed on the first insulating layer, the second insulating layer is disposed on the passivation layer and the pixel electrode layer is disposed on the second insulating layer and disposed in the first via to connect the drain;
   an opposite substrate;
   a display layer disposed between the TFT substrate and the opposite substrate; and
   a backlight module disposed on the side of the TFT substrate away from the opposite substrate.

14. The display device as recited in claim 13, wherein the material of the second sub-layer is SiNx or AlxOx.

15. The display device as recited in claim 13, wherein the thickness of the second sub-layer is between 100 Å and 2000 Å.

16. The display device as recited in claim 13, wherein the passivation layer has a second via disposed over the drain, the first via and the second via partially overlap each other to form an overlap, and the area of the overlap is less than that of the first via.

17. The display device as recited in claim 16, wherein the pixel electrode layer is further disposed in the overlap to connect the drain, and the size of the overlap is between 2 $\mu m$ and 8 $\mu m$.

18. The display device as recited in claim 16, wherein the overlap has a first side wall, and a part of the pixel electrode layer disposed in the overlap is located on the first side wall and directly contacts the passivation layer.

19. The display device as recited in claim 18, wherein the overlap further has a second side wall, and a part of the second insulating layer disposed in the overlap is located on the second side wall and directly contacts the passivation layer.

20. The display device as recited in claim 13, wherein the distance between the edges of the first sub-layer and the second sub-layer on the same side is between 0.1 $\mu m$ and 0.5 $\mu m$.

* * * * *